(12) United States Patent
Song et al.

(10) Patent No.: US 10,575,447 B2
(45) Date of Patent: Feb. 25, 2020

(54) ELECTRIC ELEMENT COOLING MODULE

(71) Applicant: Hanon Systems, Daejeon (KR)

(72) Inventors: Jun Young Song, Daejeon (KR); Hong-Young Lim, Daejeon (KR); Sun Mi Lee, Daejeon (KR); Wi Sam Jo, Daejeon (KR)

(73) Assignee: Hanon Systems, Daejeon (KR)

( * ) Notice: Subject to any disclaimer, the term of this patent is extended or adjusted under 35 U.S.C. 154(b) by 0 days.

(21) Appl. No.: 15/992,768

(22) Filed: May 30, 2018

(65) Prior Publication Data

US 2018/0352686 A1 Dec. 6, 2018

(30) Foreign Application Priority Data

May 31, 2017 (KR) .................. 10-2017-0067733
May 31, 2017 (KR) .................. 10-2017-0067919

(51) Int. Cl.
| | |
|---|---|
| *H05K 7/20* | (2006.01) |
| *H01L 23/473* | (2006.01) |
| *F28D 9/00* | (2006.01) |
| *F28F 9/02* | (2006.01) |
| *H01H 9/52* | (2006.01) |
| *H01L 23/367* | (2006.01) |
| *H01L 21/48* | (2006.01) |
| *H01L 23/40* | (2006.01) |

(52) U.S. Cl.
CPC ..... *H05K 7/20927* (2013.01); *H01L 23/3675* (2013.01); *H01L 23/473* (2013.01); *H05K 7/20254* (2013.01); *F28D 9/0043* (2013.01); *F28F 9/0246* (2013.01); *H01H 9/52* (2013.01); *H01L 21/4882* (2013.01); *H01L 23/40* (2013.01)

(58) Field of Classification Search
CPC .......... H05K 7/20927; H05K 7/20218; H05K 7/1432; H05K 7/20254; H01L 23/473; H01H 9/52; F28D 9/00–904; F28D 9/0043; F28D 1/0476; F28F 9/0246; H01M 10/613
USPC ........ 361/699; 257/714, 719; 165/80.4–80.5, 165/104.33
See application file for complete search history.

(56) References Cited

U.S. PATENT DOCUMENTS

| | | | | |
|---|---|---|---|---|
| 7,656,016 B2* | 2/2010 | Yoshimatsu | .......... | H01L 25/112 257/686 |
| 8,755,185 B2* | 6/2014 | Chou | .................. | H01L 23/3735 165/80.4 |

(Continued)

FOREIGN PATENT DOCUMENTS

| | | |
|---|---|---|
| DE | 102014225033 A1 | 11/2015 |
| DE | 112016000129 T5 | 7/2017 |

(Continued)

*Primary Examiner* — Zachary Pape
(74) *Attorney, Agent, or Firm* — Norton Rose Fulbright US LLP

(57) ABSTRACT

Provided is an electric element cooling module, and more particularly, an electric element cooling module in which opposite surfaces of an electric element surface-contacts a cooling flow passage portion in which a cooling fluid flows and, thus, an electric element is easily inserted and an interval between cooling flow passages arranged in two lines in a width direction is controlled through terminals installed inside an electric element in a width direction, thereby preventing signal interference between terminals and achieving excellent assembly.

11 Claims, 14 Drawing Sheets

(56) References Cited

U.S. PATENT DOCUMENTS

| | | | |
|---|---|---|---|
| 9,807,915 B2 * | 10/2017 | Lim | .................. H05K 7/20254 |
| 2016/0126160 A1 * | 5/2016 | Jeong | .................... H01L 23/473 |
| | | | 361/699 |
| 2017/0336152 A1 * | 11/2017 | Jeong | ...................... F28D 15/00 |
| 2017/0365890 A1 * | 12/2017 | Lim | ..................... F28D 1/0476 |

FOREIGN PATENT DOCUMENTS

| | | | | |
|---|---|---|---|---|
| JP | 2001-245478 A | 9/2001 | | |
| JP | 2007005682 A | 1/2007 | | |
| JP | 2008-294283 A | 12/2008 | | |
| WO | WO-2015037824 A1 * | 3/2015 | ........... | H01L 23/473 |
| WO | WO-2016144007 A1 * | 9/2016 | ........... | F28D 1/0476 |

* cited by examiner

[FIG. 1]
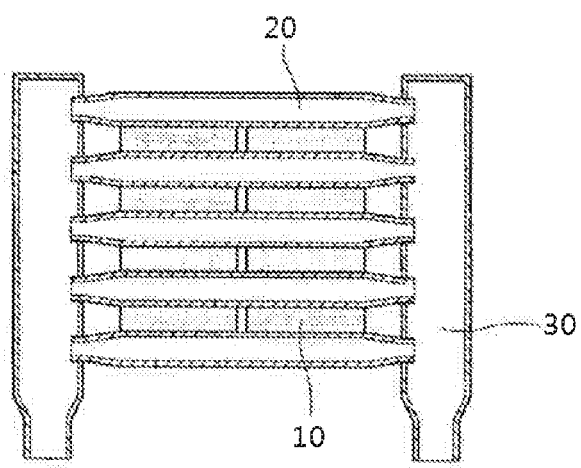
[FIG. 2]
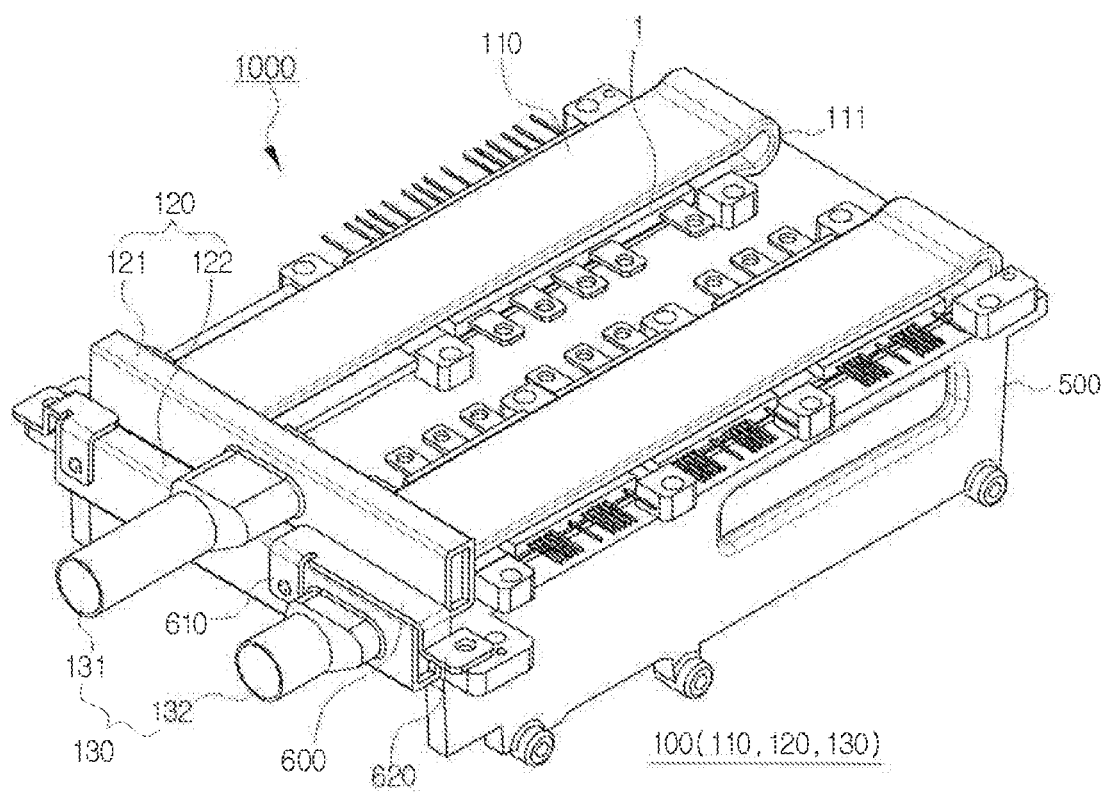

[FIG. 3]
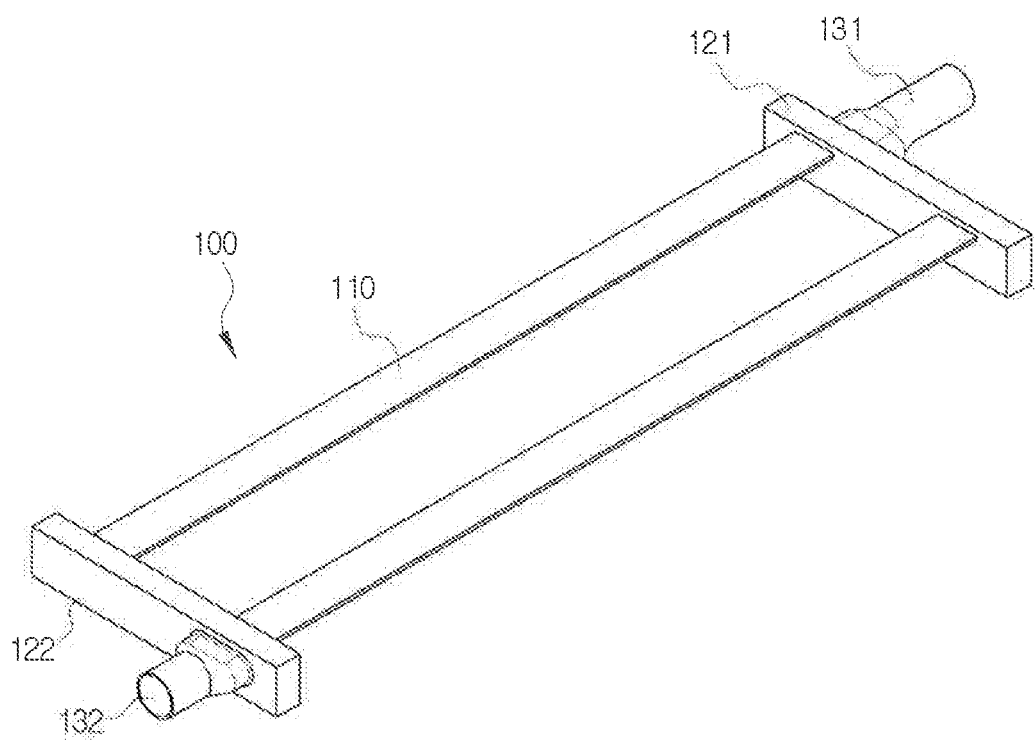

[FIG. 4]
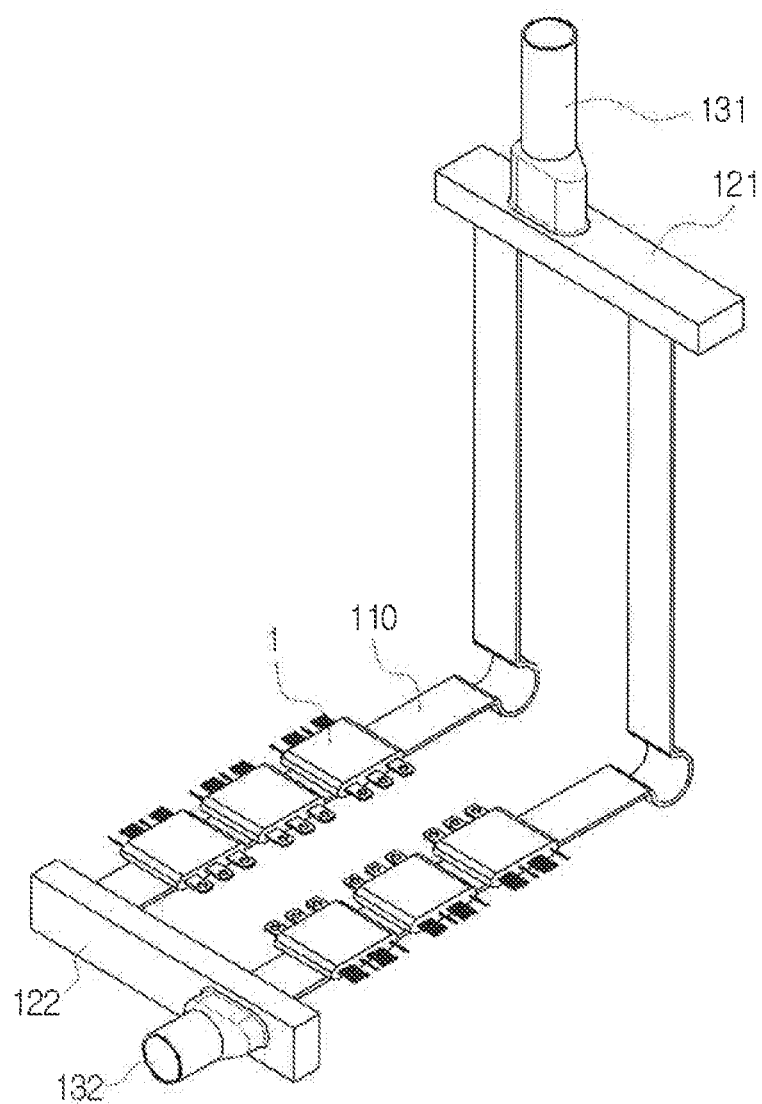

[FIG. 5]
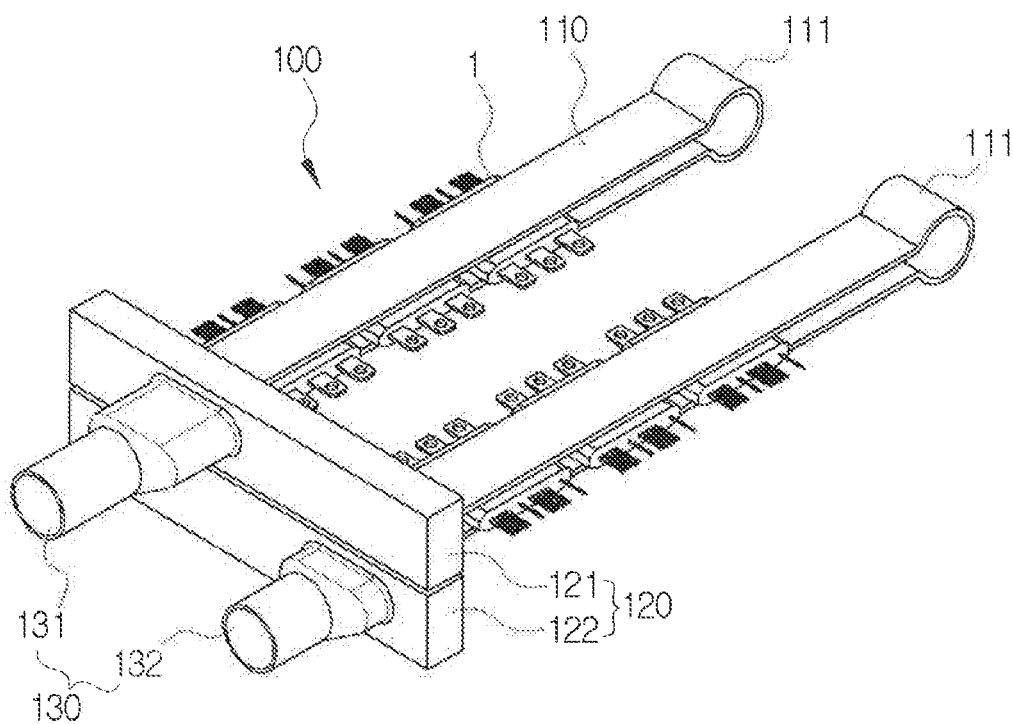
[FIG. 6]
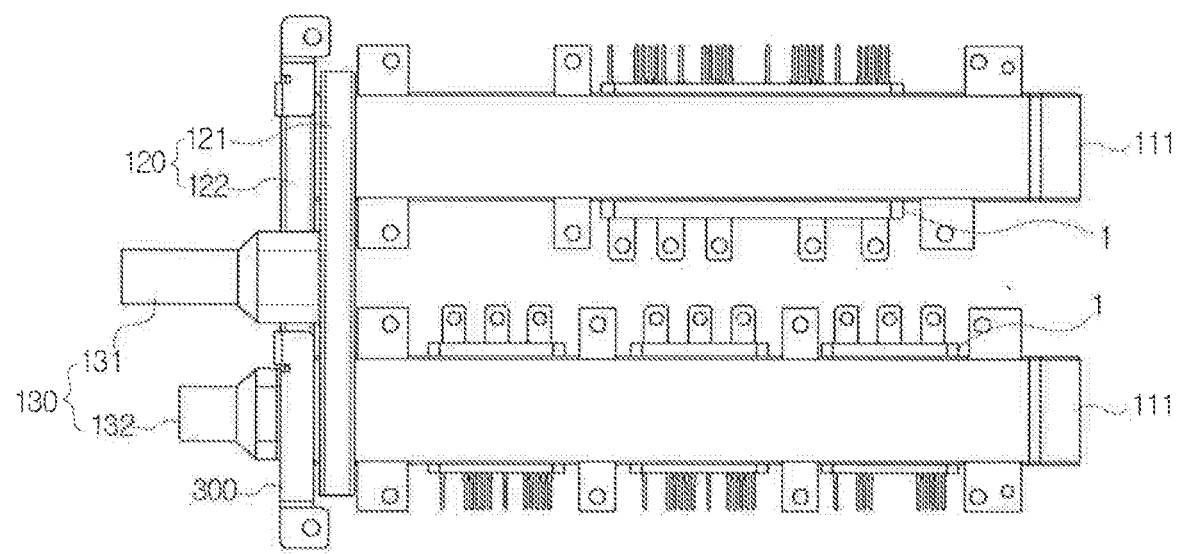

[FIG. 7]
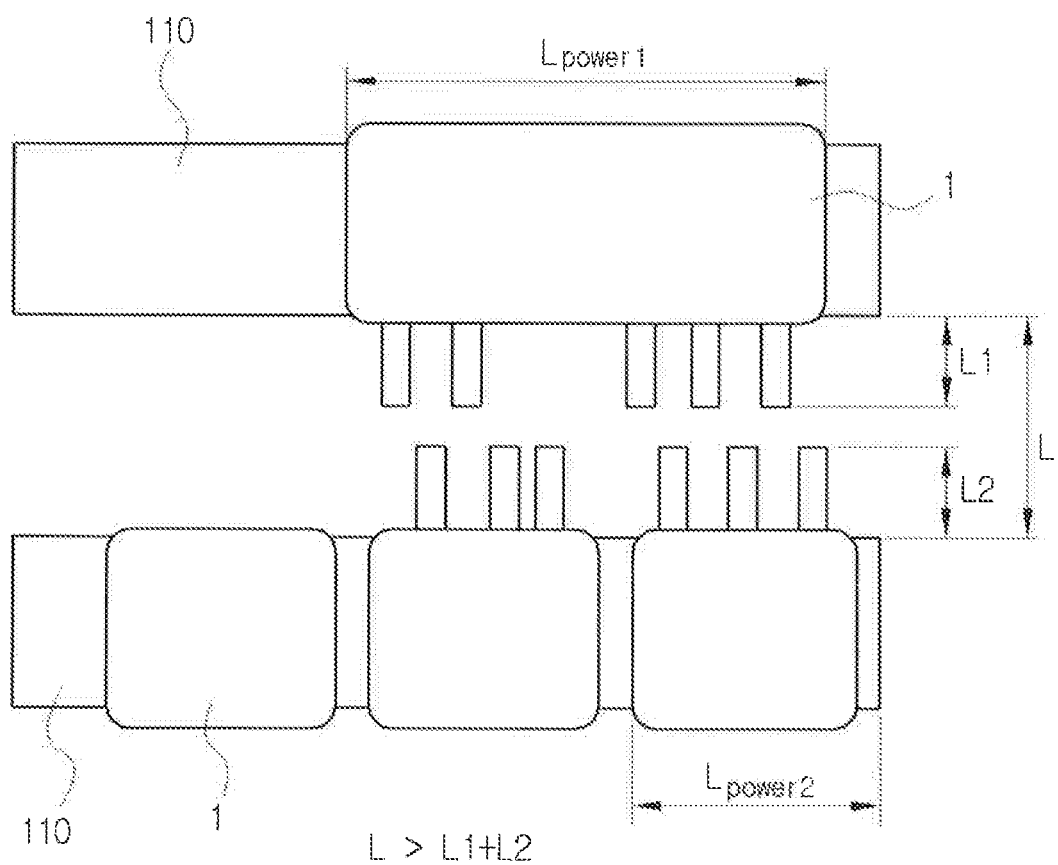
[FIG. 8]
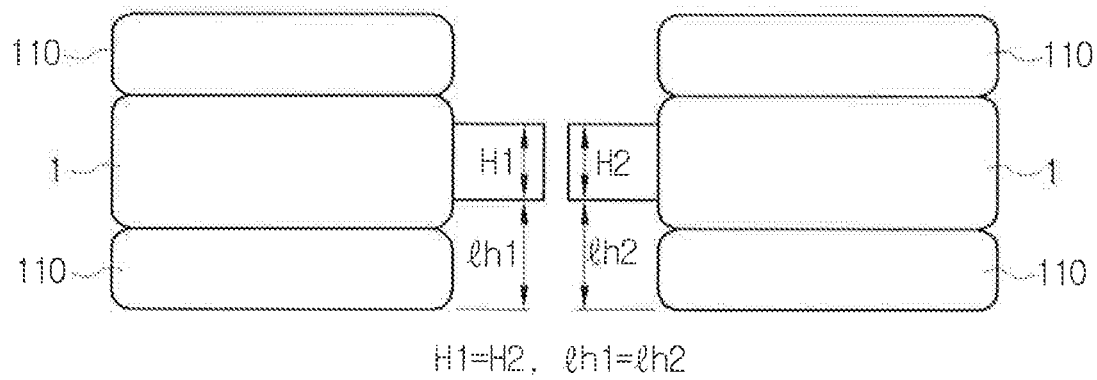

[FIG. 9]
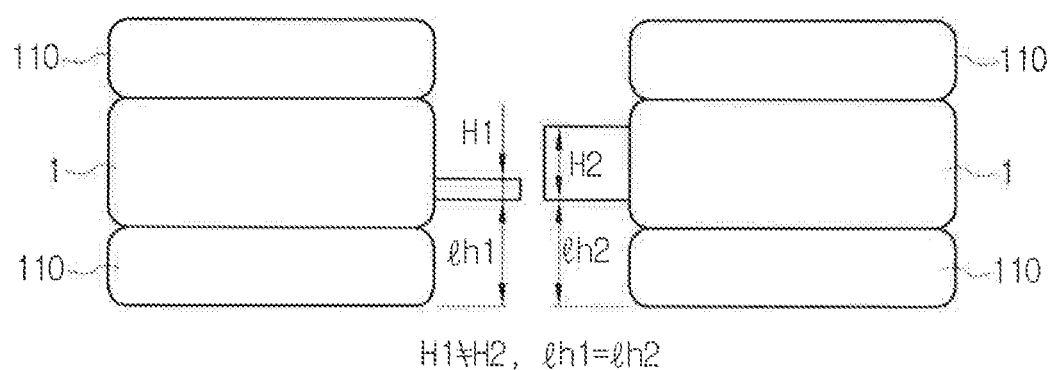
H1≠H2, ℓh1=ℓh2
[FIG. 10]
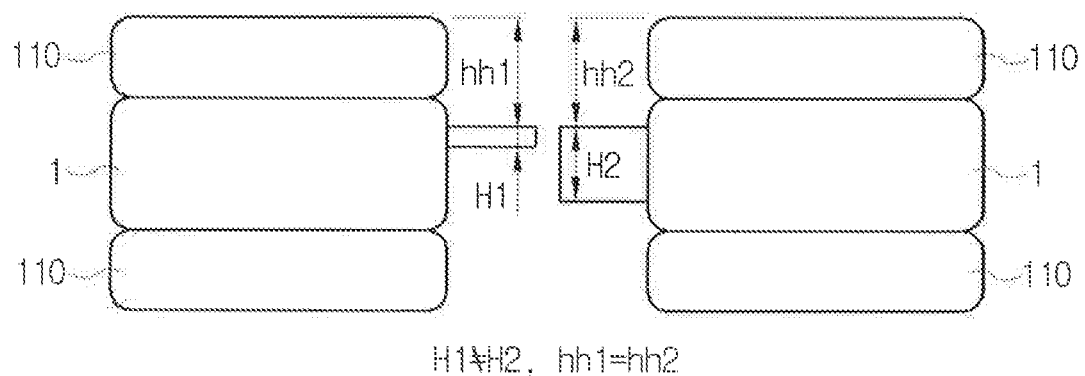
H1≠H2, hh1=hh2

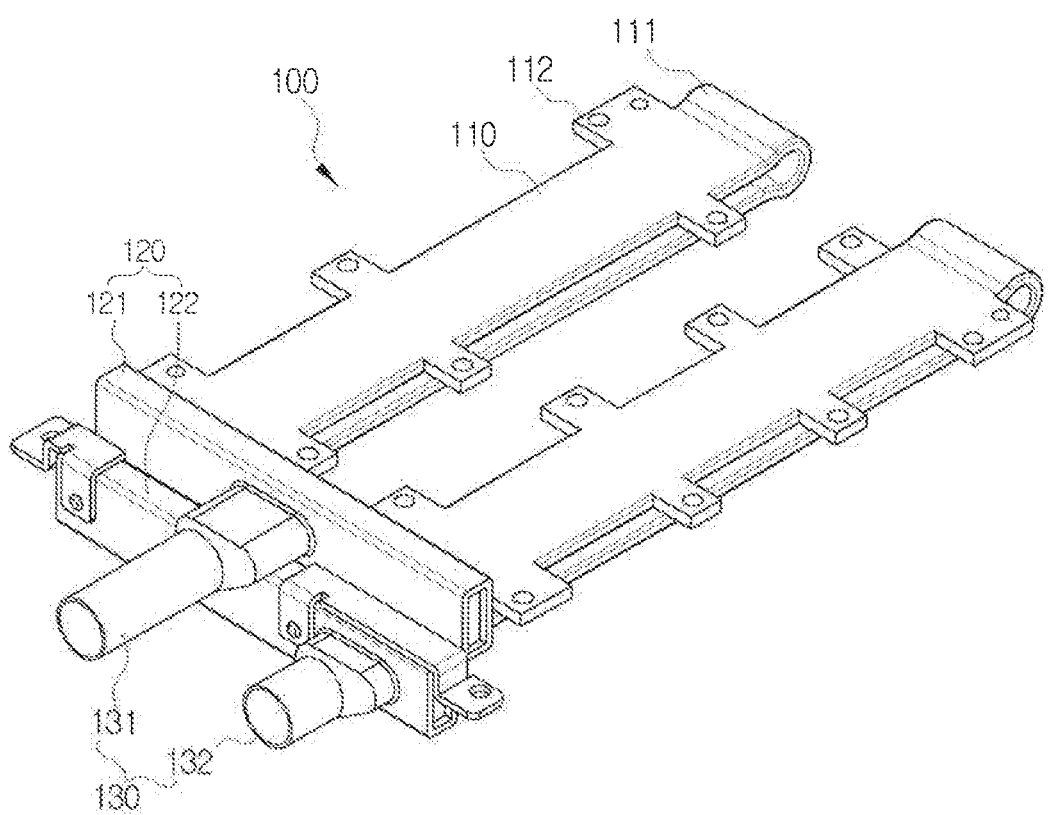
[FIG. 11]

[FIG. 12]
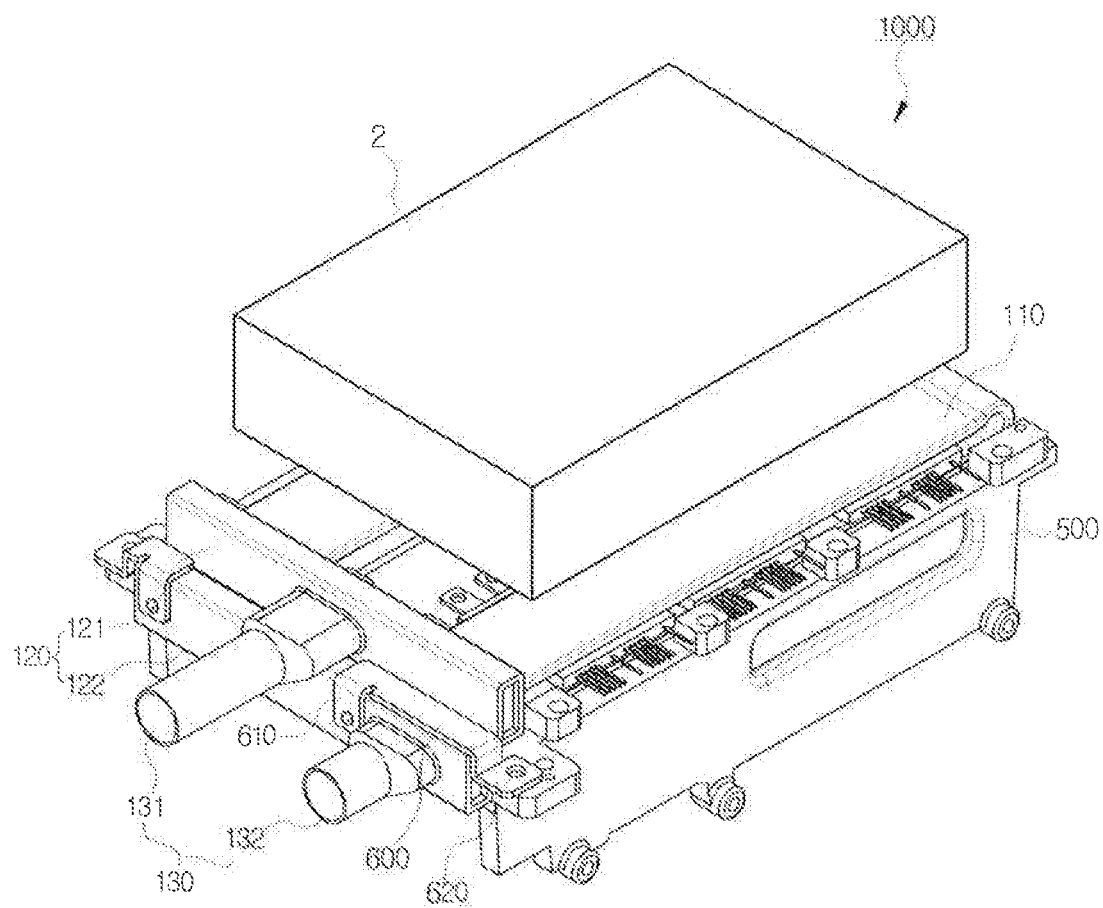

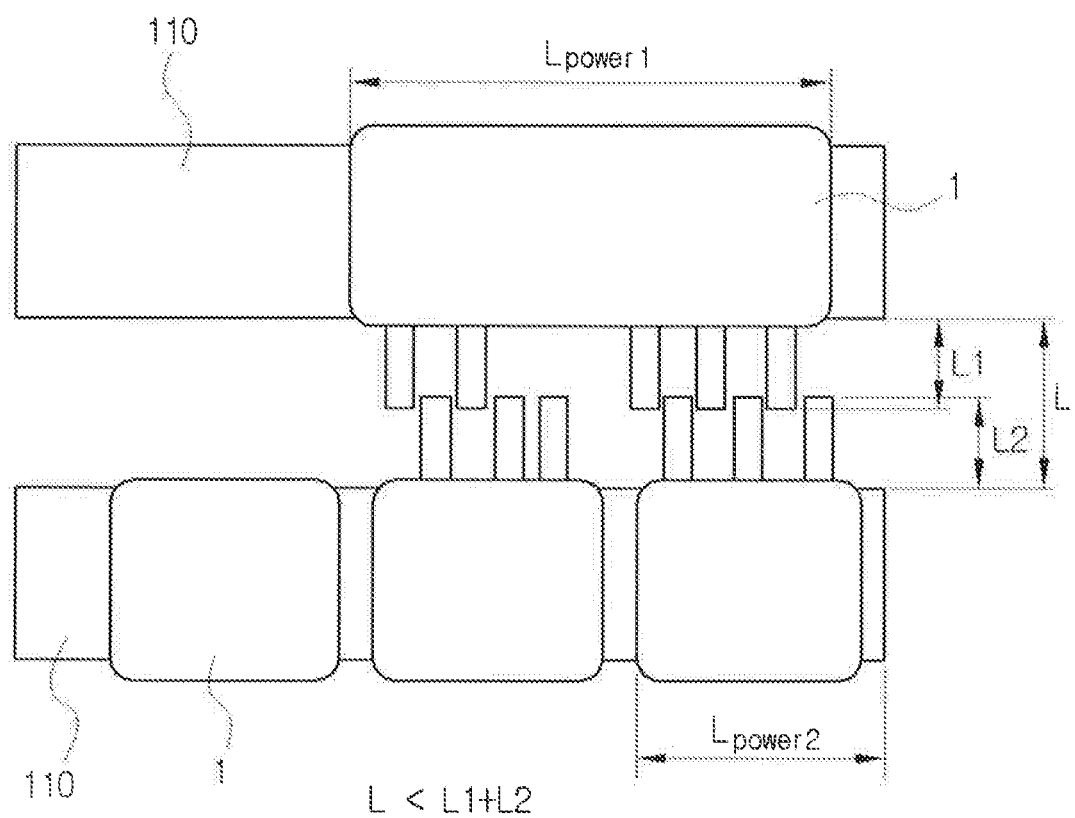
[FIG. 13]

[FIG. 14]
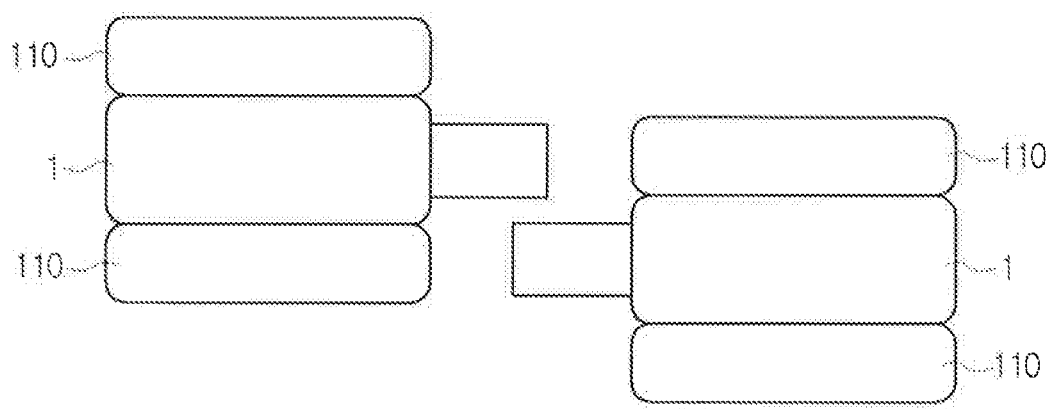
[FIG. 15]
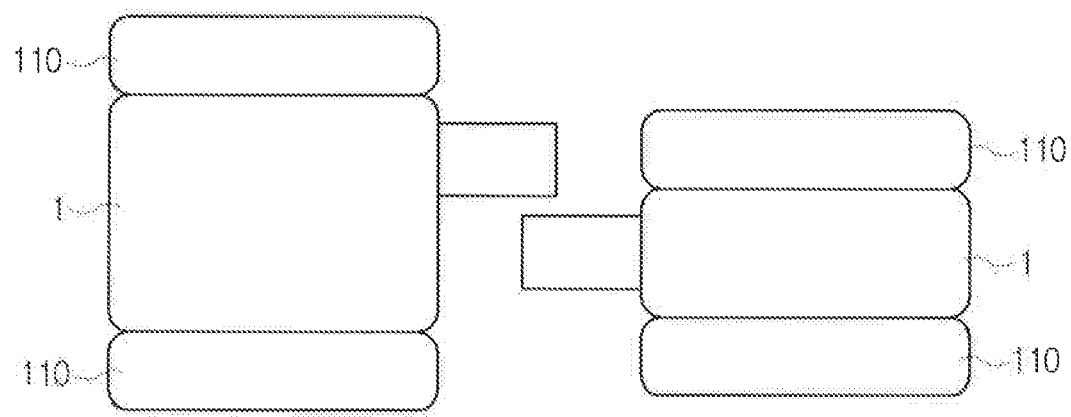

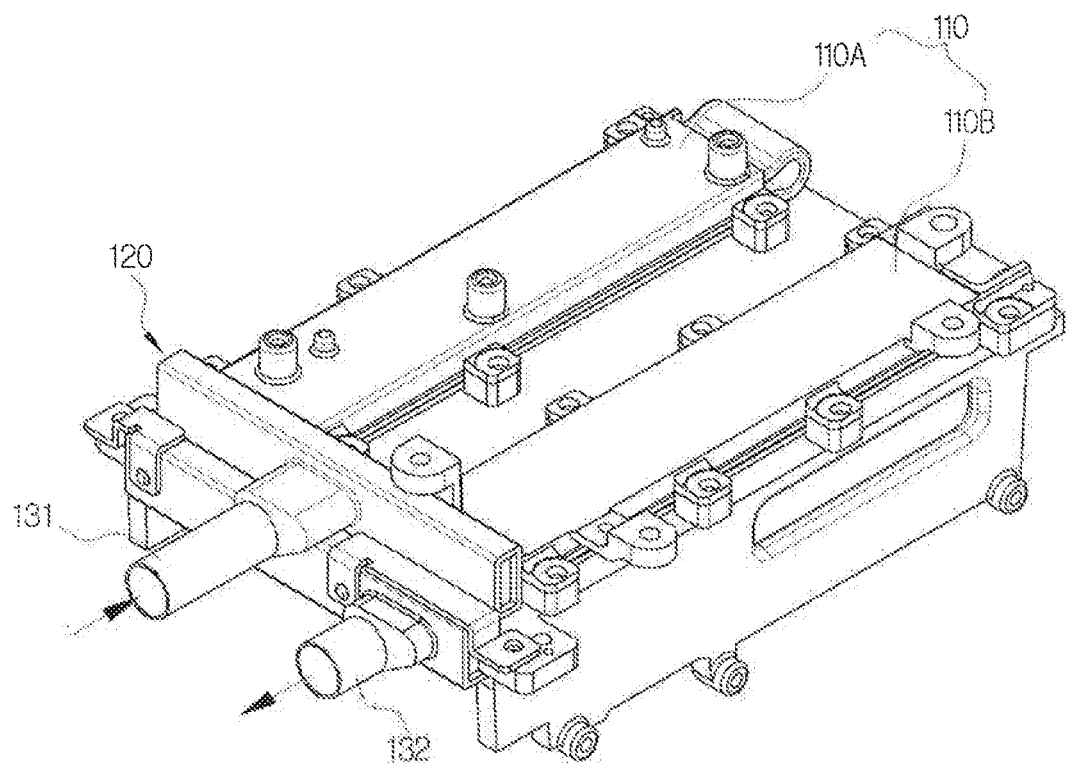
[FIG. 16]

[FIG. 17]
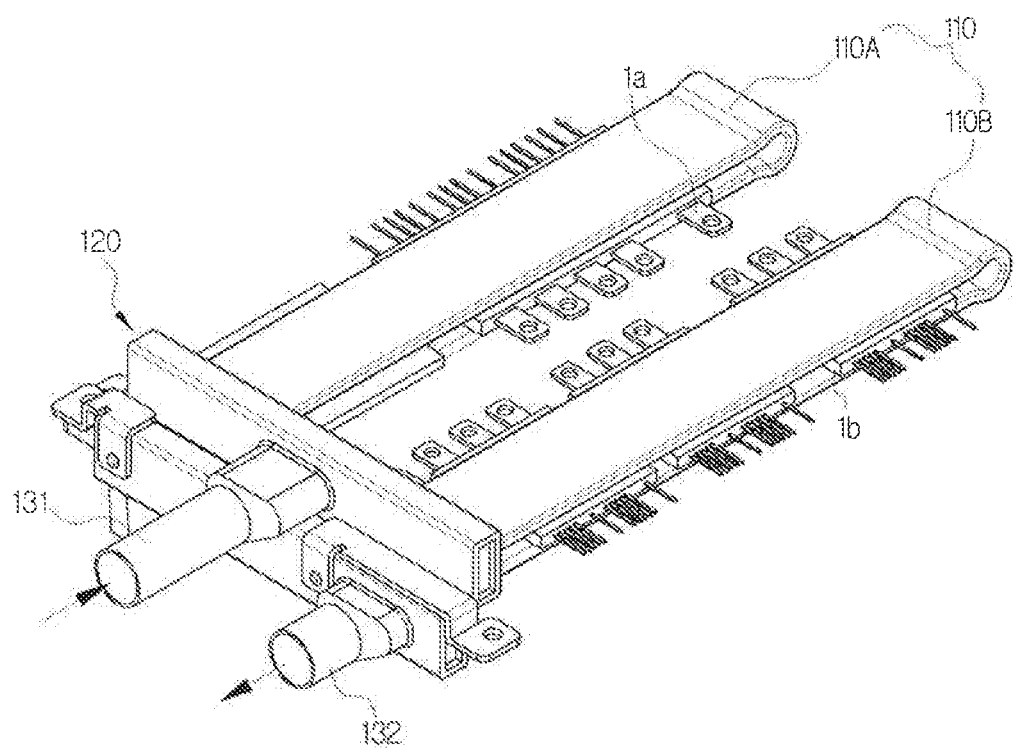

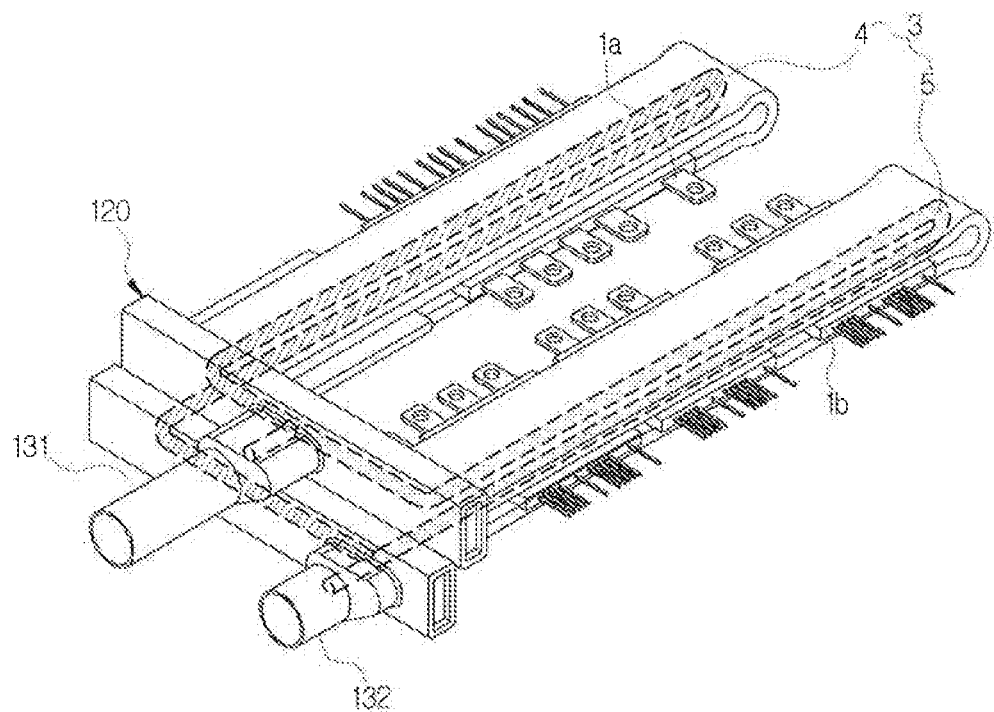
[FIG. 18]

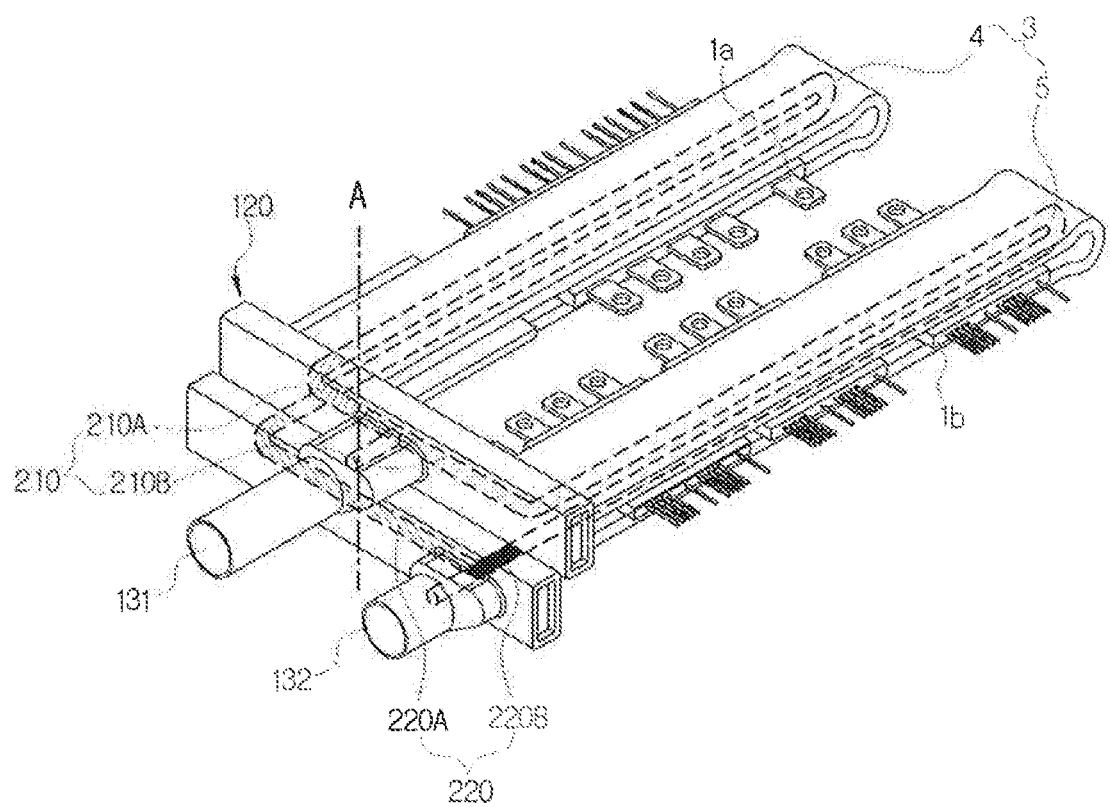
[FIG. 19]

ELECTRIC ELEMENT COOLING MODULE

CROSS-REFERENCE TO RELATED APPLICATIONS

This application claims priority under 35 U.S.C. § 119 to Korean Patent Application No. 10-2017-0067733, filed on May 31, 2017 and No. 10-2017-0067919, filed on May 31, 2017, in the Korean Intellectual Property Office, the disclosure of which is incorporated herein by reference in its entirety.

TECHNICAL FIELD

The following disclosure relates to an electric element cooling module, and more particularly, to an electric element cooling module in which opposite surfaces of an electric element surface-contact a cooling flow passage portion in which a cooling fluid flows and, thus, an electric element is easily inserted and an interval between cooling flow passages arranged in two lines in a width direction is controlled through terminals installed inside an electric element in a width direction, thereby preventing signal interference between terminals and achieving excellent assembly.

BACKGROUND

As vehicles have gradually used lots of electrical components and eco-friendly vehicles such as an electric vehicle (EV), a hybrid electric vehicle (HEV), and a plug-in hybrid electric vehicle (PHEV) have been increasingly used, the number of electric components applied to vehicles has increased.

A power module for driving such an electric component includes an insulated gate bipolar mode transistor (IGBT) device and a diode and, in this regard, the power module is seriously heated due to high integration and microminiaturization and, thus, a cooling device needs to be installed therewith to enhance performance of the power module.

The IGBT of the power module is a device for switching control of a driving motor of an eco-friendly vehicle and, along with the development of eco-friendly vehicles, cooling performance requirement is also enhanced.

Japanese Patent Laid-Open Publication No. 2001-245478 ("Inverter Cooling Device", Sep. 7, 2001) discloses an inverter that uses a semiconductor module including a semiconductor device such as an IGBT and a diode, installed therein and Japanese Patent Laid-Open Publication No. 2008-294283 ("Semiconductor Device", Dec. 4, 2008) discloses a heat sink installed to contact a lower surface of a semiconductor device and formed to exchange heat with the lower surface while predetermined flows flow in the heat sink.

The aforementioned single-side cooling method has a limit in cooling performance and, thus, a dual-side cooling method is created to overcome the limit of the single-side cooling method. The dual-side cooling method is configured by inserting devices into a heat exchanger and needs to satisfy a condition in which an interval of inserting the electric elements of the heat exchanger is greater than the height of the electric element and to simultaneously satisfy a condition in which a device and a heat exchanger are appropriately compressed to enhance heat transfer performance of the heat exchanger.

A heat exchanger of a dual-side cooling method shown in FIG. 1 may include tubes 20 positioned at opposite lateral surfaces of electric elements 10 to allow a heat exchange medium to flow therein and tanks 30 coupled to opposite ends of the tubes 20 to introduce or discharge the heat exchange medium.

In this case, the heat exchanger of the dual-side cooling method shown in FIG. 1 needs to be configured by fixing insertion spaces of the electric elements 10 via brazing and, then, inserting the electric elements 10 into the insertion spaces and, thus, it is difficult to insert the electric elements 10.

When an interval between the tubes 20 is increased to easily insert electric elements, the electric elements 10 and the tubes 20 are not appropriately adhered to each other and, thus, there is a problem in terms of degraded heat exchange efficiency.

CITED REFERENCE

Patent Document

1. Japanese Patent Laid-Open Publication No. 2001-245478 ("Inverter Cooling Device", Sep. 7, 2001)
2. Japanese Patent Laid-Open Publication No. 2008-294283 ("Semiconductor Device", Dec. 4, 2008)

SUMMARY

An exemplary embodiment of the present invention is directed to providing an electric element cooling module in which opposite surfaces of an electric element surface-contact a cooling flow passage portion in which a cooling fluid flows and, thus, an electric element is easily inserted and an interval between cooling flow passages arranged in two lines in a width direction is controlled through terminals installed inside an electric element in a width direction, thereby preventing signal interference between terminals and achieving excellent assembly.

In one general aspect, an electric element cooling module includes a cooling flow passage portion formed to allow a cooling fluid to flow therein, a header tank including a first header tank coupled to one end of the cooling flow passage and a second header tank coupled to the other end of the cooling flow passage portion and disposed above the first header tank, and a heat exchanger for cooling an electric element including an entrance pipe including an inlet pipe formed in the header tank to introduce the cooling fluid and an outlet pipe configured to discharge the cooling fluid, wherein the cooling flow passage portions are bent at predetermined points and adhered to opposite surfaces of an electric element disposed between surfaces of the cooling flow passage portions, which face each other, and are arranged in two lines to be spaced apart from each other in a width direction.

The cooling flow passage portions may be formed in such a way that an interval between the cooling flow passage portions in a width direction is greater than the sum of lengths of terminals installed inside the electric element in a width direction.

Terminals protruding inward in a width direction in the electric element may have the same height and are positioned on the same plane.

Terminals protruding inward in a width direction in the electric element may have different heights and at least one surface in a height direction is positioned on the same plane.

An interval between which terminals installed inside the electric element in the width direction may be less than a diameter of the inlet pipe.

The first header tank and the second header tank may not be arranged at the same line level in a height direction.

The electric element cooling module may further include a lower housing disposed on a lower surface of the heat exchanger for cooling the electric element.

The electric element cooling module may further include a first fix bracket fixedly coupled to any one selected from the first header tank or the second header tank and the lower housing.

The cooling flow passage portion may further include a fix portion for coupling with the lower housing.

At least one fix portion may protrude from a lateral surface in a width direction of the cooling flow passage portion and may include a through hole penetrating in a height direction.

The electric element cooling module may further include a heating component positioned on an upper surface of the cooling flow passage portion.

In another general aspect, in the electric element cooling module, the heat exchanger for cooling the electric element may include a plurality of electric elements with different heat values, and the header tank and the cooling flow passage portion may form two cooling flow passages in which a cooling fluid passes and a cooling flow passage with a relatively small length exchanges heat with an electric element with a high heat value.

The cooling flow passage may include a header tank flow passage formed on the header tank and tube flow passages formed on respective tubes, and wherein the tube flow passages may have the same length.

The header tank flow passage may include a plurality of distribution flow passage for distributing a cooling fluid introduced at the inlet pipe to each of the cooling flow passage portions and a plurality of integrated flow passages for moving a cooling fluid passing through each of the cooling flow passage portions to the outlet pipe, and the distribution flow passage and the integrated flow passage that are connected to different cooling flow passages may have different lengths.

A cooling flow passage for cooling the plurality of electric elements with different heat values may be formed in the heat exchanger for cooling the electric element, and at least one of the inlet pipe and the outlet pipe may be arranged adjacently to the electric element with a relatively high heat value.

The cooling flow passage may include a header tank flow passage formed on the header tank and a tube flow passage formed on the tube and the tube flow passages have the same length.

The header tank flow passage may include a plurality of distribution flow passages for distributing a cooling fluid introduced at the inlet pipe to each of the cooling flow passage portions and a plurality of integrated flow passages for moving a cooling fluid passing through each of the cooling flow passage portions, wherein the distribution flow passage and the integrated flow passage connected to different cooling flow passage portions may have different lengths.

A cooling flow passage for cooling the plurality of electric elements may be formed in the heat exchanger for cooling the electric element, and at least one of the inlet pipe and the outlet pipe may be arranged adjacently to the electric element with a relatively high heat value.

The cooling flow passage may include a header tank flow passage formed on the header tank and tube flow passages formed on respective tubes, and the tube flow passages may have the same length.

The header tank flow passage may include a plurality of distribution flow passage for distributing a cooling fluid introduced at the inlet pipe to each of the cooling flow passage portions and a plurality of integrated flow passages for moving a cooling fluid passing through each of the cooling flow passage portions to the outlet pipe, and the distribution flow passage and the integrated flow passage that are connected to different cooling flow passages may have different lengths.

BRIEF DESCRIPTION OF THE DRAWINGS

FIG. 1 is a diagram showing a conventional electric element cooling module.

FIG. 2 is a diagram showing an electric element cooling module according to an exemplary embodiment of the present invention.

FIGS. 3 to 6 are diagrams showing a heat exchanger for cooling an electric element of an electric element cooling module according to an exemplary embodiment of the present invention, FIG. 7 is a diagram showing an example of a heat exchanger for cooling an electric element of an electric element cooling module according to an exemplary embodiment of the present invention.

FIGS. 8 to 10 are diagrams showing another example of a heat exchanger for cooling an electric element of an electric element cooling module according to an exemplary embodiment of the present invention.

FIG. 11 is a diagram showing an example of a cooling flow passage portion included in a heat exchanger for cooling an electric element of an electric element cooling module according to an exemplary embodiment of the present invention.

FIG. 12 is a diagram showing an example of an electric element cooling module according to an exemplary embodiment of the present invention, FIGS. 13 to 15 are diagrams showing an electric element cooling module having a shape as a comparison for explanation of an effect of an electric element cooling module according to an exemplary embodiment of the present invention.

FIG. 16 is a perspective view of a heat exchanger for cooling an electric element of an electric element cooling module according to another exemplary embodiment of the present invention (when a lower housing is coupled).

FIG. 17 is a perspective view of a heat exchanger for cooling an electric element of an electric element cooling module according to another exemplary embodiment of the present invention (when a lower housing is decoupled).

FIG. 18 is a concept diagram showing a first flow passage and a second flow passage that are formed on a heat exchanger for cooling an electric element of an electric element cooling module according to another exemplary embodiment of the present invention.

FIG. 19 is a concept diagram showing a distribution flow passage and an integrated flow passage on a heat exchanger for cooling an electric element of an electric element cooling module according to another exemplary embodiment of the present invention.

[Detailed Description of Main Elements]

1000: electric element cooling module
100: heat exchanger for cooling electric element
110: cooling flow passage portion

[Detailed Description of Main Elements]

110A: first cooling flow passage portion
110B: second cooling flow passage portion
111: round portion
112: fix portion
120: header tank
121: first header tank
122: second header tank
130: entrance pipe
131: inlet pipe
132: outlet pipe
1: electric element
1a: first electric element
1b: second electric element
2: heating component
3: cooling flow passage
4: first flow passage
5: second flow passage
210: distribution flow passage
210A: first distribution flow passage
210B: second distribution flow passage
220: integrated flow passage
220A: first integrated flow passage
220B: second integrated flow passage
500: lower housing
600: first fix bracket
610: first coupler
620: second coupler

DETAILED DESCRIPTION OF EMBODIMENTS

Hereinafter, an electric element cooling module according to exemplary embodiments will be described in detail with reference to the accompanying drawings.

As shown in FIG. 2, an electric element cooling module 1000 according to an exemplary embodiment of the present invention may include an electric element cooling heat exchanger 100 for cooling a vehicular electric element and may be a module formed via assembly with a lower housing 500.

In this case, the aforementioned electric element may be a vehicular inverter, a motor driving inverter, and an air conditioner inverter, which use a semiconductor module including a semiconductor device such as an insulated gate bipolar mode transistor (IGBT) and a diode.

The electric element cooling heat exchanger 100 may broadly include cooling flow passage portions 110, a header tank 120, and an entrance pipe 130.

As shown in FIGS. 2 to 6, the cooling flow passage portions 110 may each be formed in a tube type and may allow cooling fluid to flow therein.

In this case, the cooling fluid flowing in the cooling flow passage portions 110 may be water mixed with an antifreezing liquid such as an ethylene glycol-based material, a natural refrigerant such as water and ammonia, a Fron-based refrigerant such as R134a, an alcohol-based refrigerant, or a ketone-based material such as acetone.

The cooling flow passage portions 110 may each be adhered to opposite surfaces of an electric element 1 disposed between opposite surfaces formed by bending the cooling flow passage portion 110 at predetermined points and may be arranged in two lines to be spaced apart from each other in a width direction.

The header tank 120 may include a first header tank 121 coupled to one end of the cooling flow passage portion 110 and a second header tank 122 coupled to the other end of the cooling flow passage portion 110 and the second header tank 122 may be arranged above or below the first header tank 121.

The entrance pipe 130 may include an inlet pipe 131 formed in the header tank 120 to introduce a cooling fluid thereinto and an outlet pipe 132 formed in the header tank 120 to discharge a cooling fluid and, in this regard, a cooling fluid that is introduced into the header tank 120 through the inlet pipe 131 and flows in the cooling flow passage portion 110 may be discharged through the outlet pipe 132 and, thus, the electric element 1 that contacts the cooling flow passage portion 110 may be cooled.

In this case, the first header tank 121 may introduce a cooling fluid thereinto by fixedly coupling the inlet pipe 131 to one end of the cooling flow passage portion 110 in a longitudinal direction before the cooling flow passage portion 110 is bent.

The second header tank 122 may discharge a cooling fluid therefrom by fixedly coupling the outlet pipe 132 to the other end of the cooling flow passage portion 110 in a longitudinal direction before the cooling flow passage portion 110 is bent.

That is, the electric element cooling heat exchanger 100 may be formed by fixedly coupling the header tank 120 including the first header tank 121 and the second header tank 122 to the opposite ends of the cooling flow passage portion 110 before the cooling flow passage portion 110 is bent and, then, bending the cooling flow passage portion 110 at predetermined points to allow opposite surfaces of the electric element 1 disposed on a partial region of an upper surface of the cooling flow passage portion 110 in a height direction to contact the cooling flow passage portion 110.

In this case, the electric element cooling heat exchanger 100 may be configured in such a way that the cooling flow passage portion 110 is bent while the header tank 120 including the first header tank 121 and the second header tank 122 is coupled to opposite ends of the cooling flow passage portion 110 via brazing and the first header tank 121 and the second header tank 122 are not arranged at the same line level in a height direction and, thus, even if the electric element 1 has a very thin height, the electric element 1 may be compressed by the cooling flow passage portion 110.

In other words, even if the cooling flow passage portion 110 is bent, an interval at which the electric elements 1 of the cooling flow passage portion 110 are inserted may be freely adjusted irrespective of the first header tank 121 and the second header tank 122 by arranging the first header tank 121 and the second header tank 122 in a zigzag form in a height direction rather than being stacked.

The electric element cooling heat exchanger 100 may be configured in such a way that the electric element 1 and the cooling flow passage portion 110 are adhered to each other by coating glue therebetween to fix the electric element 1 at a predetermined position between the cooling flow passage portions 110 and, in this case, the glue may be thermal grease or thermal pad.

A degree of fatigue applied to a point at which the cooling flow passage portion 110 is bent is serious and, to minimize the degree of fatigue, the cooling flow passage portion 110 may include a round portion 111 that protrudes outward at the point at which the cooling flow passage portion 110 is bent in such a way that a height of the point at which the cooling flow passage portion 110 is bent is greater than an interval between the cooling flow passage portions 110 at a point on which the electric element 1 is accommodated.

The round portion 111 may be formed at the point at which the cooling flow passage portion 110 is bent and may have a cross section with an open circular form but is not limited thereto.

In addition, the electric element cooling heat exchanger 100 of the electric element cooling module 1000 according to an exemplary embodiment of the present invention may be configured in such a way that a length L by which the cooling flow passage portions 110 are arranged in two lines to be spaced apart from each other in a width direction is greater than the sum L1+L2 of lengths of terminals installed inside the electric element 1 in a width direction, as shown in FIGS. 6 and 7.

In more detail, in general, with regard to the electric element cooling heat exchanger 100 of the electric element cooling module 1000, when the cooling flow passage portions 110 are arranged in two lines in a width direction, the electric element 1 may be formed in such a way that a power terminal such as a semiconductor module is installed inward in a width direction and a signal terminal is installed outward in a width direction.

In this case, a control circuit board, etc., electrically connected to a signal terminal may be positioned on opposite surfaces of the electric element cooling heat exchanger 100 in a width direction.

That is, the electric element cooling heat exchanger 100 included in the electric element cooling module 1000 according to an exemplary embodiment of the present invention may be configured in such a way that the length L by which the cooling flow passage portions 110 are arranged in two lines to be spaced apart from each other is greater than the sum L1+L2 of lengths of terminals installed inward in the cooling flow passage portion 110 arranged in two lines and, thus, terminals may be prevented from overlapping with each other, thereby preventing signal interference between power terminals installed inward.

In addition, terminals installed inward in a width direction may be arranged to be spaced apart from each other rather than overlapping in a width direction and, thus, may be easily assembled and the necessity of arranging the terminals in a zigzag form in a longitudinal direction is also degraded to avoid interference between the terminals, thereby minimizing a length of a package from being accordingly increased in a longitudinal direction.

FIG. 13 is a diagram showing the case in which the sum L1+L2 of lengths of terminals installed inward is greater than the length L at which the cooling flow passage portions 110 are spaced apart from each other. To prevent terminals (power terminals) installed inward from overlapping with each other, the terminals need to be arranged in a zigzag form in a longitudinal direction and, thus, may not be easily assembled, the plurality of electric elements 1 may not be cooled, and there is a problem in that a length of a package in a longitudinal direction is increased due to terminals arranged in a zigzag form.

As described above, the electric element cooling heat exchanger 100 may be configured in such a way that the length L at which the cooling flow passage portions 110 are spaced apart from each other is greater than the sum L1+L2 of lengths of terminals installed inward and, thereby preventing signal interference between terminals installed inward and, thus, as shown in FIG. 8, the terminals installed inside the electric elements 1 in a width direction may have the same height and the terminals with the same height may be installed on the same plane.

That is, as described above, since signal interference between terminals installed inward in a width direction may be prevented, the necessity of arranging the terminals in a zigzag form in a height direction in the prior art is degraded and, thus, to easily assemble the terminals, the terminals may be installed inward in a width direction and, in this case, terminals with the same height may be installed on the same plane.

In other words, the electric element cooling module 1000 according to an exemplary embodiment of the present invention may be configured in such a way that a package of the electric element cooling heat exchanger 100 may be prevented from being increased in a height direction and, simultaneously, signal interference between terminals may be prevented.

As shown in FIGS. 9 and 10, terminals installed inward in the electric elements 1 in a width direction may have different heights and, in this regard, the terminals with different heights may be installed in such a way that any one selected from opposite surfaces in a height direction is positioned on the same plane.

That is, as described above, with regard to the terminals installed inward in a width direction, the length L at which the cooling flow passage portions 110 are spaced apart from each other may be greater than the sum L1+L2 of the lengths of the terminals installed inward and, thus, interference between the terminals may be prevented and, to easily assemble the terminals, the terminals may be installed inward in a width direction and, in this case, terminals with different heights may be installed in such a way that at least one surface of opposite surfaces in a height direction is positioned on the same plane.

In other words, the terminals may be arranged to overlap with each other in a height direction to prevent interference between the terminals and, thus, a package in a height direction may be increased and, on the other hand, the electric element cooling heat exchanger 100 of the electric element cooling module 1000 according to an exemplary embodiment of the present invention may prevent interference between terminals installed inward in a width direction and, thus, when the terminals have different heights to ensure easy assembly, at least one surface in a height direction may be positioned on the same plane.

FIGS. 14 and 15 are diagrams showing the case in which the sum L1+L2 of lengths of terminals installed inward is greater than the length L at which the cooling flow passage portions 110 are spaced apart from each other. To prevent signal interference between terminals, the terminals may be arranged in a zigzag form in a height direction and, thus, a package may be increased in a height direction, which limits cost reduction and miniaturization.

The length L at which terminals installed inside the electric element 1 in a width direction may be smaller than a diameter of the inlet pipe 131.

That is, the electric element cooling heat exchanger 100 may be formed in such a way that the length L at which terminals installed inside the electric element 1 in a width direction is less than the diameter of the inlet pipe 131, thereby miniaturizing the electric element cooling module 1000 according to an exemplary embodiment of the present invention and, thus, it may be possible to apply the electric element cooling module 1000 that is capable of being miniaturized to various-size vehicles including an eco-friendly vehicle.

As shown in FIG. 2, the electric element cooling module 1000 according to an exemplary embodiment of the present invention may further include a first fix bracket 600 that is fixedly coupled to any one selected from the first header tank 121 or the second header tank 122 and the lower housing 500.

The first fix bracket 600 may be formed to surround a portion of upper and lateral surfaces of the first header tank 121 or the second header tank 122 and may include a first coupler 610 coupled to the first header tank 121 or the second header tank 122 at one end and a second coupler 620 coupled to the lower housing 500 at the other end.

As described above, the first fix bracket 600 may be configured in such a way that the first coupler 610 is coupled to the first header tank 121 or the second header tank 122 and the second coupler 620 is fixedly coupled to the lower housing 500 and, in this case, a predetermined region of the first coupler 610 may be temporarily assembled with the header tank 120 via a rivet and, then, the remaining region may be coupled to the header tank 120 via brazing.

As shown in FIG. 11, the cooling flow passage portion 110 may further include at least one fix portion 112 that is formed on a lateral surface for coupling with the lower housing 500.

The fix portion 112 may protrude from a lateral surface of the cooling flow passage portion 110 in a width direction to be coupled directly to the lower housing 500.

In this case, to fix the fix portion 112 directly to the lower housing 500, the fix portion 112 may include a through hole penetrating in a height direction, fixing the cooling flow passage portion 110 directly to the lower housing 500 using a method such as a rivet manner and, thus, it may not be required to use an upper housing or the like for coupling and compressing the cooling flow passage portion 110 to the lower housing 500.

That is, the electric element cooling module 1000 according to an exemplary embodiment of the present invention is configured in such a way that the electric element cooling heat exchanger 100 is fixed directly to the lower housing 500 without a separate member and, thus, assembly of an electric element cooling module may be advantageously enhanced and manufacturing costs may also be advantageously reduced because additional cost for separately forming an upper housing is not required.

However, needless to say, a configuration of the fix portion 112 for coupling and fixing the cooling flow passage portion 110 directly to the lower housing 500 may be configured in various shapes and fixing methods according to various embodiments of the present invention other than the aforementioned shape and fixing method.

As shown in FIG. 12, the electric element cooling module 1000 may be configured in such a way that the cooling flow passage portion 110 is fixed directly to the lower housing 500 without a separate member such as an upper housing and, thus, a heating component 2 may be disposed on an upper surface of the cooling flow passage portion 110 to cool the heating component 2.

That is, since the heating component 2 such as an LDC, an HDC, and a capacitor is disposed on the upper surface of the cooling flow passage portion 110, the heating component 2 as well as the electric element 1 inserted between the cooling flow passage portions 110 may be simultaneously cooled.

When the heating component 2 is cooled, compression between the cooling flow passage portion 110 and the electric element 1 may also be enhanced through the heating component 2 disposed on the upper surface, thereby enhancing cooling performance.

Hereinafter, a heat exchanger for cooling an electric element of an electric element cooling module according to another exemplary embodiment of the present invention is described. Hereinafter, in the drawings, the same elements are denoted by the same reference numerals, and a repeated explanation thereof will not be given.

Referring to FIG. 16, the heat exchanger for cooling the electric element of the electric element cooling module according to the present invention may include the inlet pipe 131 into which a cooling fluid is injected, the header tank 120 for distributing the cooling fluid introduced at the inlet pipe 131, the plurality of cooling flow passage portions 110 for exchange heat between the cooling fluid introduced from the header tank 120 and an arbitrary electric element, and the outlet pipe 132 for collecting and discharging a cooling fluid passing through the cooling flow passage portion 110. The header tank 120 and the cooling flow passage portion 110 may form a plurality of cooling flow passages for passing a cooling fluid to cool an electric element positioned between the cooling flow passage portions 110 and, in this case, a flow rate of the cooling fluid passing through the cooling flow passage portion 110 may be controlled to correspond to a heat value of the electric element to effectively cool each electric element.

In more detail, a vehicle using a motor, such as a hybrid vehicle, a fuel cell vehicle, and an electric vehicle requires a plurality of electric elements for controlling an HSG and a motor, and since the respective electric elements have different heat values, a plurality of cooling flow passages for cooling respective electric elements may be formed to adjust a flow rate of a cooling fluid that flows through each cooling flow passage according to a heat value of the electric element, thereby effectively cooling the electric element.

In this case, a plurality of cooling flow passages may be formed to correspond to the number of electric elements as a cooling target and, hereinafter, a structure formed by using two electric elements and forming two cooling flow passages to correspond to the two electric elements is exemplified.

Referring to FIGS. 17 and 18, the heat exchanger for cooling the electric element of the electric element cooling module according to an exemplary embodiment of the present invention may be configured in such a way that a cooling flow passage 3 includes a first flow passage 4 in which a cooling fluid for cooling a first electric element 1a with a relatively low heat value flows, and a second flow passage 5 in which a cooling fluid for cooling a second electric element 1b with a relatively high heat value flows and, in this case, a flow rate of the cooling fluid flowing in the second flow passage 5 may be greater than a flow rate of the cooling value flows in the first flow passage 4, thereby effectively cooling the first electric element 1a and a second electric element 2a.

In more detail, the first flow passage 4 and the second flow passage 5 may have different lengths to cause a pressure drop difference therebetween and, thus, as much cooling fluid as possible may be introduced into a fluid passage with low pressure drop.

In this case, a method of controlling lengths of the first flow passage 4 and the second flow passage 5 may include a method of controlling positions of the inlet pipe 131 and the outlet pipe 132, a method of controlling a length of a distribution flow passage 210 for distributing a cooling fluid introduced at the inlet pipe 131 to each of the cooling flow passage portions 110 or a length of an integrated flow passage 220 for collecting a cooling fluid passing through each of the cooling flow passage portions 110 to the outlet pipe 132, and a method of controlling a length of each of the cooling flow passage portions 110 and, hereinafter, embodiments thereof are described.

First Embodiment

The heat exchanger for cooling the electric element of the electric element cooling module according to the present invention may control positions of the inlet pipe 131 and the outlet pipe 132 and, thus, the first flow passage 4 and the second flow passage 5 may have different lengths.

Referring to FIGS. 17 and 19, the header tank 120 may include the distribution flow passage 210 including a first distribution flow passage 210A for distributing a cooling fluid introduced at the inlet pipe 131 to a first cooling flow passage portion 110A for cooling the first electric element 1a and a second distribution flow passage 210B for distributing the cooling fluid to a second cooling flow passage portion 110B for cooling the second electric element 1b, and the integrated flow passage 220 including a first integrated flow passage 220A for moving a cooling fluid discharged through the first cooling flow passage portion 110A to the outlet pipe 132 and a second integrated flow passage 220B for moving a cooling fluid discharged through the second cooling flow passage portion 110B to the outlet pipe 132 and, in this case, the first cooling flow passage portion 110A and the second cooling flow passage portion 110B may be symmetrical with each other in right and left directions based on a central line A in an upward and downward direction of the header tank 120 and, simultaneously, may have the same length.

Accordingly, as shown in FIG. 17, at least one of the inlet pipe 131 and the outlet pipe 132 may be arranged adjacently to the second cooling flow passage portion 110B for cooling the second electric element 1b with a relatively high heat value and, thus, a length of the second flow passage 5 may be less than a length of the first flow passage 4.

In this case, at least one of the inlet pipe 131 and the outlet pipe 132 is arranged adjacently to a side at which the second cooling flow passage portion 110E is positioned, which means that, needless to say, when positions of the inlet pipe 131 and the outlet pipe 132 are controlled to a minimize a distance between the distribution flow passage 210 and the integrated flow passage 220, the sum of total lengths of the second distribution flow passage 210B and the second integrated flow passage 220B is less than the sum of total lengths of the first distribution flow passage 210A and the first integrated flow passage 220A.

In the above case, when the first electric element 1a and the second electric element 1b have different heat values, this is caused by a configuration difference between the first electric element 1a and the second electric element 1b but, as illustrated in FIG. 17, the heat value difference is caused by a number of differences therebetween and, accordingly, needless to say, at least one of the inlet pipe 131 and the outlet pipe 132 may be arranged adjacently to the second electric element 1b configured by combining three devices or the second cooling flow passage portion 110E for exchanging heat with the second electric element 1b.

Second Embodiment

The heat exchanger for cooling the electric element of the electric element cooling module according to the present invention may control lengths of the first distribution flow passage 210A and the second distribution flow passage 210B and lengths of the first integrated flow passage 220A and the second integrated flow passage 220B and, thus, the first flow passage 4 and the second flow passage 5 may have different lengths.

Referring to FIGS. 18 and 19, a total length of the first flow passage 4 may correspond to the sum of the first distribution flow passage 210A, the first integrated flow passage 220A, and a flow passage formed in the first cooling flow passage portion 110A, a total length of the second flow passage 5 may correspond to the sum of the second distribution flow passage 210B, the second integrated flow passage 220B, and a flow passage formed in the second cooling flow passage portion 110B, and the first cooling flow passage portion 110A and the second cooling flow passage portion 110B may have the same flow passage length.

Accordingly, a total length of the second distribution flow passage 210B and the second integrated flow passage 220B may be less than a total length of the first distribution flow passage 210A and the first integrated flow passage 220A and, thus, even if positions of the inlet pipe 131 and the outlet pipe 132 are varied according to an assembly position in a vehicle, a length of the second flow passage 5 may be less than a length of the first flow passage 4.

In this case, in the drawings, the case in which the inlet pipe 131 and the outlet pipe 132 are symmetrically arranged with each other based on the central line A in an upward and downward direction is illustrated but, even if the inlet pipe 131 and the outlet pipe 132 are arranged adjacently to the first electric element 1a according to an assembly position in a vehicle, lengths of the distribution flow passage 210 and the integrated flow passage 220 may be controlled to control a flow rate of a cooling fluid, needless to say.

The heat exchanger for cooling the electric element of the electric element cooling module according to the present invention may be configured with a bending structure in which the first cooling flow passage portion 110A and the second cooling flow passage portion 110B contact upper and lower surfaces of the electric elements 1a and 1b, thereby maximizing heat exchange efficiency between the cooling flow passage portion 110 and the electric elements 1a and 1b, needless to say.

In the electric element cooling module according to the present invention, opposite surfaces of an electric element may surface-contact a cooling flow passage portion in which a cooling fluid flows and, thus, an electric element may be advantageously inserted and cooling performance may be advantageously excellent along with cooling of the opposite surfaces of the electric element.

In the electric element cooling module according to the present invention, an interval between cooling flow passage portions arranged in two lines in a width direction may be controlled through terminals installed inside the electric element in a width direction and, thus, signal interference between the terminals may be advantageously prevented.

In the electric element cooling module according to the present invention, an interval between cooling flow passage portions may be controlled through terminals installed in a width direction and, thus, at least one of the heights of the installed terminals may correspond to each other to advantageously achieve excellent package assembly.

It will be obvious to those skilled in the art to which the present invention pertains that the present invention described above is not limited to the above-mentioned exemplary embodiments and the accompanying drawings, but may be variously substituted, modified, and altered without departing from the scope and spirit of the present invention.

What is claimed is:

1. An electric element cooling module comprising:
a cooling flow passage portion formed to allow a cooling fluid to flow therein;
a header tank including a first header tank coupled to one end of the cooling flow passage portion and a second header tank coupled to the other end of the cooling flow passage portion and disposed above the first header tank; and
a heat exchanger for cooling an electric element including an entrance pipe including an inlet pipe formed in the header tank to introduce the cooling fluid and an outlet pipe configured to discharge the cooling fluid,
wherein the cooling flow passage portions are bent at predetermined points and adhered to opposite surfaces of an electric element disposed between surfaces of the cooling flow passage portions, which face each other, and are arranged in two lines to be spaced apart from each other in a width direction, wherein the cooling flow passage portions are formed in such a way that an interval between the cooling flow passage portions in a width direction is greater than the sum of lengths of terminals installed inside the electric element in a width direction, wherein the electric element cooling module further comprises a lower housing disposed on a lower surface of the heat exchanger for cooling the electric element, and a first fix bracket fixedly coupled to any one selected from the first header tank or the second header tank and the lower housing, and wherein an interval in the width direction between the terminals in one of the two lines and in the other two lines is less than a diameter of the inlet pipe.

2. The electric element cooling module of claim 1, further comprising a heating component positioned on an upper surface of the cooling flow passage portion.

3. The electric element cooling module of claim 1, wherein the terminals disposed in one of the two lines are different in height from those in the other one of the two lines, and wherein the terminals in the two lines are aligned such that any one selected from opposite surfaces thereof in a height direction is positioned on the same plane.

4. An electric element cooling module comprising:

a cooling flow passage portion formed to allow a cooling fluid to flow therein;

a header tank including a first header tank coupled to one end of the cooling flow passage portion and a second header tank coupled to the other end of the cooling flow passage portion and disposed above the first header tank; and a heat exchanger for cooling an electric element including an entrance pipe including an inlet pipe formed in the header tank to introduce the cooling fluid and an outlet pipe configured to discharge the cooling fluid, wherein the cooling flow passage portions are bent at predetermined points and adhered to opposite surfaces of an electric element disposed between surfaces of the cooling flow passage portions, which face each other, and are arranged in two lines to be spaced apart from each other in a width direction, wherein the cooling flow passage portions are formed in such a way that an interval between the cooling flow passage portions in a width direction is greater than the sum of lengths of terminals installed inside the electric element in a width direction, wherein the electric element cooling module further comprises a lower housing disposed on a lower surface of the heat exchanger for cooling the electric element, and wherein the cooling flow passage portion further includes a fix portion for coupling with the lower housing, and at least one fix portion protrudes from a lateral surface in a width direction of the cooling flow passage portion and includes a through hole penetrating in a height direction.

5. The electric element cooling module of claim 4, wherein the terminals disposed in one of the two lines are different in height from those in the other one of the two lines, and wherein the terminals in the two lines are aligned such that any one selected from opposite surfaces thereof in a height direction is positioned on the same plane.

6. The electric element cooling module of claim 4, wherein an interval in the width direction between the terminals in one of the two lines and in the other one of the two lines is less than a diameter of the inlet pipe.

7. An electric element cooling module comprising:

a cooling flow passage portion formed to allow a cooling fluid to flow therein;

a header tank including a first header tank coupled to one end of the cooling flow passage portion and a second header tank coupled to the other end of the cooling flow passage portion and disposed above the first header tank; and a heat exchanger for cooling an electric element including an entrance pipe including an inlet pipe formed in the header tank to introduce the cooling fluid and an outlet pipe configured to discharge the cooling fluid, wherein the cooling flow passage portions are bent at predetermined points and adhered to opposite surfaces of an electric element disposed between surfaces of the cooling flow passage portions, which face each other, and are arranged in two lines to be spaced apart from each other in a width direction, wherein the heat exchanger for cooling the electric element includes a plurality of electric elements with different heat values; and wherein the header tank and the cooling flow passage portion form two cooling flow passages in which a cooling fluid passes and a cooling flow passage with a relatively small length exchanges heat with an electric element with a high heat value.

8. The electric element cooling module of claim 7, wherein the cooling flow passage includes a header tank flow passage formed on the header tank and tube flow passages formed on the respective cooling flow passage portions; and wherein the tube flow passages have the same length.

9. The electric element cooling module of claim 8, wherein the header tank flow passage includes a plurality of distribution flow passages for distributing a cooling fluid introduced at the inlet pipe to each of the cooling flow passage portions and a plurality of integrated flow passages for moving a cooling fluid passing through each of the cooling flow passage portions to the outlet pipe; and wherein the plurality of distribution flow passages and the plurality of integrated flow passages that are connected to different cooling flow passages have different lengths.

10. An electric element cooling module comprising:

a cooling flow passage portion formed to allow a cooling fluid to flow therein;

a header tank including a first header tank coupled to one end of the cooling flow passage portion and a second header tank coupled to the other end of the cooling flow passage portion and disposed above the first header tank; and a heat exchanger for cooling an electric element including an entrance pipe including an inlet pipe formed in the header tank to introduce the cooling fluid and an outlet pipe configured to discharge the cooling fluid, wherein the cooling flow passage portions are bent at predetermined points and adhered to opposite surfaces of an electric element disposed between surfaces of the cooling flow passage portions, which face each other, and are arranged in two lines to be spaced apart from each other in a width direction, a cooling flow passage for cooling the plurality of electric elements with different heat values is formed in the heat exchanger for cooling the electric element, and at least one of the inlet pipe and the outlet pipe is arranged adjacently to the electric element with a relatively high heat value, wherein the cooling flow passage includes a header tank flow passage formed on the header tank and tube flow passages formed on the respective cooling flow passage portions, wherein the tube flow passages have the same length and wherein the header tank flow passage includes a plurality of distribution flow passages for distributing a cooling fluid introduced at the inlet pipe to each of the cooling flow passage portions and a plurality of integrated flow passages for moving a cooling fluid passing through each of the cooling flow passage portions to the outlet pipe, wherein the plurality of distribution flow passages and the plurality of integrated flow passages connected to different cooling flow passage portions have different lengths.

11. An electric element cooling module comprising:

a cooling flow passage portion formed to allow a cooling fluid to flow therein;

a header tank including a first header tank coupled to one end of the cooling flow passage portion and a second header tank coupled to the other end of the cooling flow passage portion and disposed above the first header tank; and a heat exchanger for cooling an electric element including an entrance pipe including an inlet pipe formed in the header tank to introduce the cooling fluid and an outlet pipe configured to discharge the cooling fluid, wherein the cooling flow passage portions are bent at predetermined points and adhered to opposite surfaces of an electric element disposed between surfaces of the cooling flow passage portions, which face each other, and are arranged in two lines to be spaced apart from each other in a width direction, a cooling flow passage for cooling the plurality of electric elements is formed in the heat exchanger for cooling the electric element, and at least one of the inlet pipe and the outlet pipe is arranged adjacently to the electric element with a relatively high heat value, wherein the cooling flow passage includes a header tank flow passage formed on the header tank and tube flow passages formed on the respective cooling flow passage portions and the tube flow passages have the same length, wherein the header tank flow passage includes a plurality of distribution flow passages for distributing a cooling fluid introduced at the inlet pipe to each of the cooling flow passage portions and a plurality of integrated flow passages for moving a cooling fluid passing through each of the cooling flow passage portions to the outlet pipe, and wherein the plurality of distribution flow passages and the plurality of integrated flow passages that are connected to different cooling flow passages have different lengths.

* * * * *